(12) United States Patent
Roberts, Jr.

(10) Patent No.: US 9,848,074 B2
(45) Date of Patent: Dec. 19, 2017

(54) CELLPHONE TRANSFER STICK

(76) Inventor: David Roberts, Jr., Saint Louis, MO (US)

( * ) Notice: Subject to any disclaimer, the term of this patent is extended or adjusted under 35 U.S.C. 154(b) by 0 days.

(21) Appl. No.: 13/357,020

(22) Filed: Jan. 24, 2012

(65) Prior Publication Data

US 2013/0190047 A1    Jul. 25, 2013

(51) Int. Cl.
*H04M 1/725*    (2006.01)
*H05K 5/02*    (2006.01)

(52) U.S. Cl.
CPC ...... *H04M 1/72527* (2013.01); *H05K 5/0278* (2013.01); *H04M 1/72525* (2013.01)

(58) Field of Classification Search
CPC .................................................. H05K 5/0278
USPC ...................................... 455/557, 558, 550.1
See application file for complete search history.

(56) References Cited

U.S. PATENT DOCUMENTS

| | | | |
|---|---|---|---|
| 2004/0180692 A1* | 9/2004 | Yang et al. | 455/557 |
| 2005/0020248 A1* | 1/2005 | Wellhausen | 455/412.2 |
| 2008/0182618 A1* | 7/2008 | Gustavsson et al. | 455/557 |
| 2008/0191033 A1* | 8/2008 | Cuellar | G06K 19/072 235/492 |
| 2009/0075593 A1* | 3/2009 | Demirbasa et al. | 455/41.2 |
| 2012/0248512 A1* | 10/2012 | Herberholz | H01L 23/4824 257/288 |
| 2016/0250640 A1* | 9/2016 | Williams | B01L 3/5027 |

* cited by examiner

*Primary Examiner* — Creighton Smith
(74) *Attorney, Agent, or Firm* — Jerry D Haynes; Law Office of Jerry D Haynes PA

(57) ABSTRACT

A generally rectangular shaped cellphone transfer stick that includes a casing with a distal end, a memory system that is housed within the casing that includes a flash memory that stores data and a billing coding system to ensure a user's cellphone account is properly billed, an input connector to insert into the user's cellphone and an attachment ring disposed on the casing that hangs or attaches the cellphone transfer stick to an exterior attachment device. The memory system also receives any combination of downloaded user data, one or more ring tones or one or more games from the user's broken cellphone that is transferred and downloaded onto the user's new cellphone.

10 Claims, 2 Drawing Sheets

CELLPHONE TRANSFER STICK

TECHNICAL FIELD & BACKGROUND

Replacing a cellphone that has been lost, stolen or damaged often results in the loss of important contacts, applications, downloads, pictures, and messages. Currently available limited alternatives to SIM cards that avoid the problems and inconveniences of malfunctioning SIM cards that erase themselves or with data transferability that is limited only to contacts and multimedia.

The present invention generally relates to a transfer stick. More specifically, the invention is a cellphone transfer stick.

It is an object of the invention to provide a cellphone transfer stick that allows a user improved data accessibility on a mobile phone.

It is an object of the invention to provide a cellphone transfer stick that allows a user a cellular phone multimedia transfer stick that enables a user to access a plurality of downloads, ring tones, games, and other cellphone applications regardless of the cellphone that is being used at the time.

It is an object of the invention to provide a cellphone transfer stick that is inserted into any cellphone, computer, or pay phone that allows the user to access information or make phone calls which are billed to the user's personal mobile phone account.

What is really needed is a cellphone transfer stick that allows a user improved data accessibility on a mobile phone that allows the user a cellular phone multimedia transfer stick that enables the user to access a plurality of downloads, ring tones, games, and other cellphone applications regardless of the cellphone that is being used at the time that is inserted into any cellphone, computer, or pay phone that allows the user to either access information or make phone calls which are billed to the user's personal mobile phone account.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention.

However, the order of description should not be construed as to imply that these operations are necessarily order dependent. In particular, these operations need not be performed in the order of presentation.

The phrase "in one embodiment" is utilized repeatedly. The phrase generally does not refer to the same embodiment, however, it may. The terms "comprising", "having" and "including" are synonymous, unless the context dictates otherwise.

Figure 1:
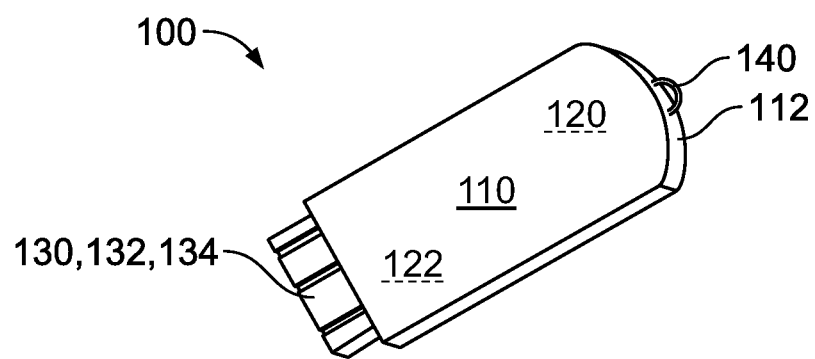
FIG. 1 illustrates a front perspective view of a cellphone transfer stick, in accordance with one embodiment of the present invention.

FIG. 1 illustrates a front environmental perspective view of a cellphone transfer stick 100, in accordance with one embodiment of the present invention.

The cell phone transfer stick 100 allows a user improved data accessibility on a mobile phone that allows the user a cellular phone multimedia transfer stick that enables the user to access any combination of downloads, ring tones, games, and other cellphone applications regardless of the cellphone that is being used at the time that is inserted into any cellphone, computer, or pay phone that allows the user to either access information or make phone calls which are billed to the user's personal mobile phone account.

The cell phone transfer stick 100 includes a casing 110, a memory system 120, an input connector 130 and an attachment ring 140. The casing 110 has a distal end 112 and is typically made of durable hard plastic, however the casing 110 can be made of any suitable material such as metal as well. The memory system 120 is a flash memory 122 that can store data in the range of 2 megabytes to 256 gigabytes or any other suitable quantity of data. The memory system 120 also includes other typically provided features of a billing coding system 122 and a flash memory 124 such as a USB mass storage controller device or other suitable type of memory system storage media. The billing coding system 122 ensures that the user's cellphone account is properly billed with the correct monetary amount, billing cycle dates and other suitably related information. The memory system 120 can receive downloaded data such as any combination of downloads, ring tones, games, and other cellphone applications from a broken cellphone that can be transferred and downloaded onto a new cellphone. This is relatively more convenient and easier than utilizing a SIM card that is limited in transferring only cellphone data that includes contact information and pictures and photos. The input connector 130 is typically a USB input connector 132 but can be any other suitable input connector such as an adapted USB input connector 134. The attachment ring 140 is typically disposed on the distal end 112 of the casing 110, but can be disposed on any portion of the casing 110. The attachment ring 140 can be hung or attached to a key chain, but can be hung or attached to any suitable exterior attachment device.

The cell phone transfer stick 100 is generally rectangular-shaped and is in the range of approximately 1.5 inches to 2.0 inches long and approximately 0.5 inch in thickness. It is also relatively lightweight and is relatively small enough to fit in a user's shirt pocket or be conveniently carried in a user's pants pocket or any other suitable carrying area.

Figure 2:
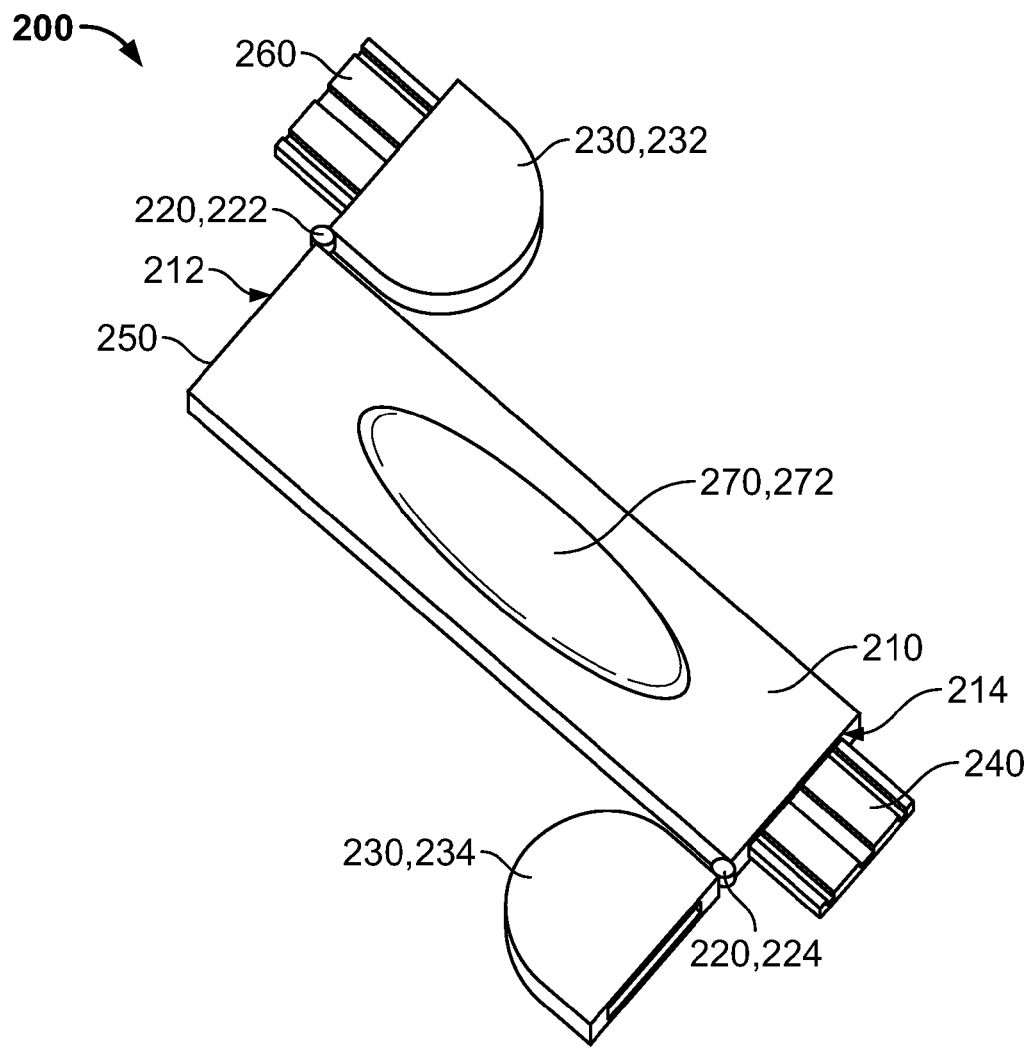
FIG. 2 illustrates a front perspective view of a cellphone transfer stick, in accordance with one embodiment of the present invention.

FIG. 2 illustrates a front perspective view of a cellphone transfer stick 200, in accordance with one embodiment of the present invention. Similarly to the cell phone transfer stick 100 illustrated and described in FIG. 1, the second embodiment of the cellphone transfer stick 200 illustrated in FIG. 2 allows a user improved data accessibility on a mobile phone that allows the user a cellular phone multimedia transfer stick that enables the user to access any combination of downloads, ring tones, games, and other cellphone applications regardless of the cellphone that is being used at the time that is inserted into any cellphone, computer, or pay phone that allows the user to either access information or make phone calls which are billed to the user's personal mobile phone account.

The cell phone transfer stick 200 includes a casing 210, a pair of hinges 220, a pair of caps 230, a male USB interface 240, a female USB interface 250, a rubber stopper 260 and an electronic finger print 270. The casing 210 includes a distal end 212 and a proximal end 214. The casing 210 is typically an impact resistant casing 212 that is typically made of plastic, but can be made of any other suitable material. The pair of hinges 220 include a first hinge 222 disposed on the distal end 212 of the casing 210 and a second hinge 224 disposed on the proximal end 214 of the casing 210. The pair of caps 230 includes a first cap 232 and a second cap 234 that are attached to the pair of hinges 220 at the distal end 212 and proximal end 214 of the casing 210. The caps 232,234 are also optionally removal if desired by the user. The male USB interface 240 is hingedly protected and covered by the first cap 232 attached to the first hinge 222 disposed on the proximal end 214 of the casing 210 and can be inserted into any suitable USB port and suitable device. The female USB interface 250 is hingedly protected and covered by the second cap 234 attached to the distal end 212 of the casing 210 by the second hinge 224 and serves the same purpose as the male USB interface 240. The female USB interface 250 and the male USB interface 240 allows easier information transfer when two media devices are present and both media devices have either one or more male USB connectors or one or more female USB ports. The rubber stopper 260 disposed on the second cap 234 to secure the female USB interface 250. The electronic finger print 270 is disposed on the casing 210 and can be replaced with a touch screen 272 when the cellphone transfer stick 200 is utilized in combination with a cell phone (not shown) to activate the cellphone transfer stick 200 or any type of suitable properly fitted media device with a USB port, connector or adaptor.

Additionally, the cellphone transfer stick 200 is embedded with coding to ensure that one or more calls or downloads purchased will be billed to the owner of the cell phone transfer stick 200 in use and not the owner of the cell phone or media device in use. Compatible with all cellphones, the cellphone transfer stick enables a user to access any combination of downloads, ring tones, games, and other related cellphone applications, regardless of the phone that is being used at the time.

The cellphone transfer stick can be plugged into any type of cellphone such as a smartphone, computer, or even a suitable pay phone, and allows the user to either access information or make phone calls which are billed to their personal mobile phone account. When using the cellphone transfer stick, cellphone related data can be securely transferred and accessed for product versatility. Additionally, the cellphone transfer stick is embedded with coding to ensure that are only made by the owner will be billed for purchases or phone calls that are made on the stick, thereby eliminating improper use of the cellphone transfer stick. The cellphone transfer stick features a lightweight casing made from impact-resistant plastic to maximize damage protection. The cellphone transfer stick is relatively sleek and compact for increased portability, and can be easily stored in a pocket or even hung from or attached to a keychain.

The cellphone transfer stick is a multimedia storage device designed to store, transport and transfer information from one communications device to another and to interact with any communications device through the use of USB technology. The cell phone transfer stick design features two USB ports. The two ports include a female port on one end, easily secured with a rubber stopper attached to an impact resistant plastic cap, and a male interface occupying the opposing end easily secured with an additional impact resistant plastic cap. Both caps are connected to the main body via miniature hinges for ease of use. The purpose of both USB ports is to access the information saved to the cellphone transfer stick for upload and download and to transfer information to or from the cellphone transfer stick from or to other media and communications devices.

When the cellphone transfer stick is connected to a communications device, a password is required to access the information on the stick. The password is set by the owner upon initial use of the cell phone transfer stick but may be changed anytime for security purposes. To input the password, the keyboard on the communications device or number pad is used. Touchscreen pattern based passcodes and fingerprint recognition technology may also be utilized. Upon input of the correct password, digital interface is achieved between the cellphone transfer stick and the communications device. Once this interface is achieved, a digital copy of the stored cell phone information is auto uploaded to the communications device which allows the device to be used as if it were the stored cell phone, therefore, providing access to all information stored without permanently saving information to the device being used. All communications (i.e., calls, texts, downloads, and other suitable communications.) sent or received will be saved directly to the cellphone transfer stick. All charges incurred for use of service will be charged to the account of stored cellphone, not to the account of the device in use. While the cellphone transfer stick is in use, the communications device being used will be completely inaccessible without express consent from the devices owner. Again, the password/passcode of the device being used must be entered.

To download information to and from the cellphone transfer stick, consent must be given by both parties (password input on both ends). To download to the cellphone transfer stick, select a "download" tab from the cellphone transfer stick menu, select information to be downloaded (select "update" for specific information additions, or select "overwrite" to replace specific files or to replace all information on the cell phone transfer stick). Verify the information to be added or replaced is correct. Prompt the user to select the "ok" tab if information is correct to begin or complete the download process. (For complete overwrite of the cellphone transfer stick, password must be re-entered as affirmation). To download from the cellphone transfer stick to the device, select "download" tab from the menu which reads (From cell stick to device), select information to be downloaded. Select the "update" tab for specific information, additions or an "overwrite" to replace specific files or to replace all information on the device. (Complete overwrites are best used for cellphone to cell phone transfers). Verify that the information to be added and or replaced is correct by selecting the "ok" tab to begin/complete the download process. For complete overwrite of device in question, password/passcode must be reentered as affirmation.

While the present invention has been related in terms of the foregoing embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

The invention claimed is:

1. A generally rectangular cellphone transfer stick, comprising:
   a casing that includes a distal end and a proximal end;
   a memory system that is housed within said casing that includes a flash memory that stores data and a billing coding system to ensure a user's cellphone account is properly billed;
   a pair of hinges that include a first hinge disposed on said distal end of said casing and a second hinge disposed on said proximal end of said casing;
   a pair of caps that includes a first cap and a second cap that are attached to said pair of hinges at said distal end and proximal end of said casing;
   a male USB interface that is hingedly protected and covered by said first cap attached to said first hinge disposed on said proximal end of said casing and is inserted into a USB port;
   a female USB interface that is hingedly protected and covered by said second cap attached to said distal end of said casing by said second hinge and is inserted into said USB port;
   a rubber stopper that is disposed on said second cap to secure said female USB interface; and
   an electronic finger print that is disposed on said second cap to secure said female USB interface.

2. The cellphone transfer stick according to claim 1, wherein said casing is an impact resistant casing that is made of plastic.

3. The cellphone transfer stick according to claim 1, wherein said casing is made of durable and hardened metal.

4. The cellphone transfer stick according to claim 1, wherein said memory system receives any combination of downloaded said user data, one or more ring tones or one or more games from a user's broken cellphone that is transferred and downloaded onto a said user's new cellphone.

5. The cellphone transfer stick according to claim 1, wherein said memory system stores data in the range of 2 megabytes to 256 gigabytes.

6. The cellphone transfer stick according to claim 1, wherein said caps are removable.

7. The cellphone transfer stick according to claim 1, wherein said electronic finger print is disposed on said casing and is replaced with a touch screen.

8. The cellphone transfer stick according to claim 1, wherein said touch screen is utilized in combination with a cell phone to activate said cellphone transfer stick.

9. The cellphone transfer stick according to claim 1, wherein said cellphone transfer stick is in the range of approximately 1.5 inches to 2.0 inches long and approximately 0.5 inch in thickness.

10. The cellphone transfer stick according to claim 1, wherein said cellphone transfer stick fits in a said user's shirt pocket or is carried in a said user's pants pocket.

* * * * *